US011211818B2

(12) United States Patent
Paatero

(10) Patent No.: US 11,211,818 B2
(45) Date of Patent: Dec. 28, 2021

(54) POWER SUPPLY ASSEMBLY

(71) Applicant: ABB Schweiz AG, Baden (CH)

(72) Inventor: Esa-Kai Paatero, Helsinki (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/157,234

(22) Filed: Jan. 25, 2021

(65) Prior Publication Data

US 2021/0234395 A1    Jul. 29, 2021

(30) Foreign Application Priority Data

Jan. 28, 2020   (EP) ..................................... 20153995

(51) Int. Cl.
*H02J 9/00* (2006.01)
*H02J 9/06* (2006.01)
*H02J 1/08* (2006.01)

(52) U.S. Cl.
CPC .............. *H02J 9/061* (2013.01); *H02J 1/086* (2020.01); *H02J 9/062* (2013.01)

(58) Field of Classification Search
CPC .. H02J 9/061; H02J 1/086; H02J 9/062; H02J 9/068; G01R 31/50; G01R 31/327
USPC ......................................................... 307/64
See application file for complete search history.

(56) References Cited

U.S. PATENT DOCUMENTS

| | | | |
|---|---|---|---|
| 2006/0221523 A1* | 10/2006 | Colombi | ............... H02M 7/493 361/90 |
| 2013/0193760 A1 | 8/2013 | Colombi et al. | |
| 2017/0163088 A1 | 6/2017 | Toyoda | |

OTHER PUBLICATIONS

Extended European Search Report; Application No. 20153995.4; dated Jun. 8, 2020; 5 Pages.

* cited by examiner

*Primary Examiner* — Richard Tan
(74) *Attorney, Agent, or Firm* — Whitmyer IP Group LLC

(57) ABSTRACT

A power supply assembly including a load supply converter system and energy saving transfer route both connected electrically to a load connection. The energy saving transfer route bypasses the load supply converter system, and includes a bypass switch system having a first bypass switch and second bypass switch connected in series. A control system of the power supply assembly is adapted to provide a system diagnostic operation including providing a diagnostic state for the bypass switch system by controlling the first bypass switch into a non-conducting state, and controlling the second bypass switch into a conducting state, generating a diagnostic voltage in an output of the load supply converter system, and detecting a short circuit incident if an electric current flowing through the bypass switch system exceeds a predetermined short circuit threshold value.

16 Claims, 1 Drawing Sheet

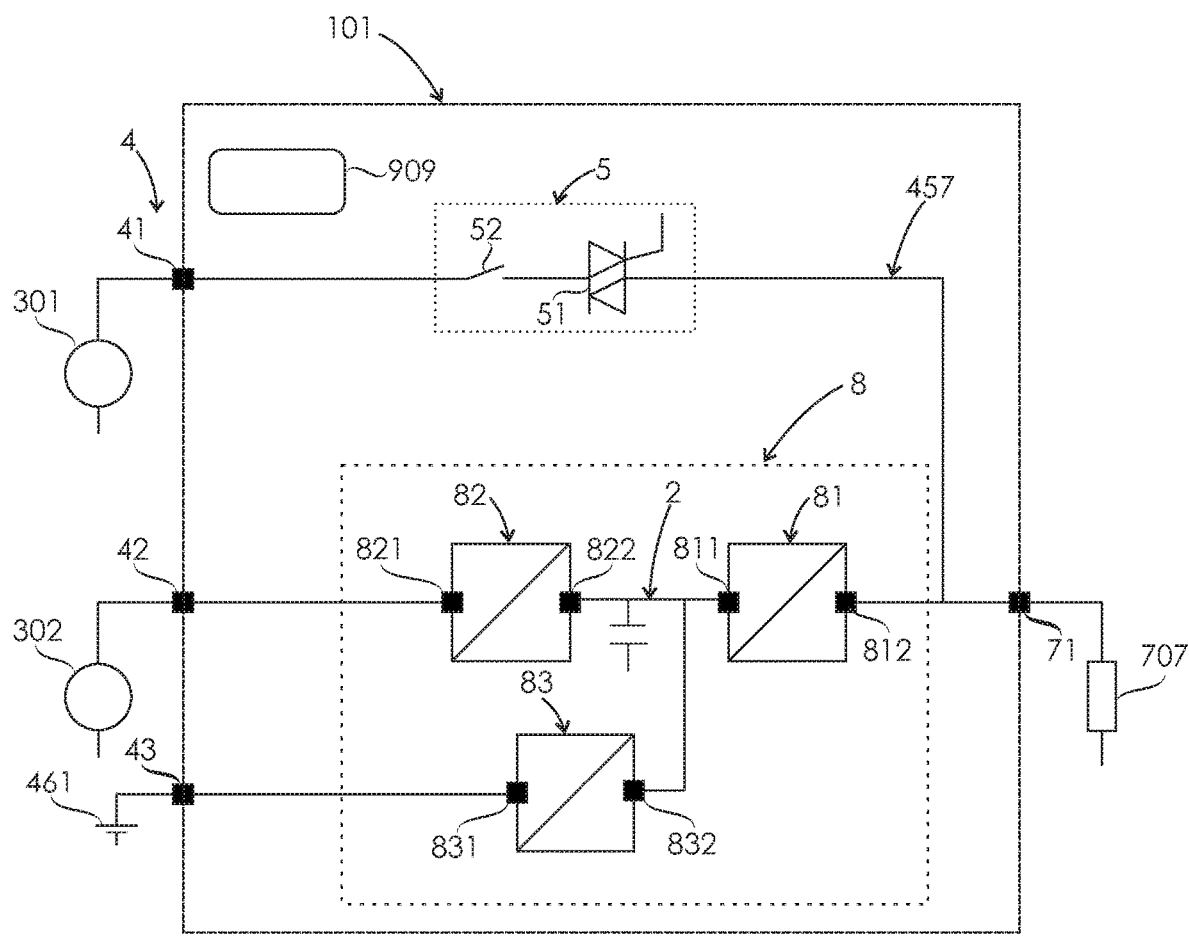

POWER SUPPLY ASSEMBLY

TECHNICAL FIELD

The present invention relates to a power supply assembly.

BACKGROUND

A known power supply assembly comprises a load supply converter system and energy saving transfer route both connected electrically to a load of the power supply assembly. The energy saving transfer route bypasses the load supply converter system, and comprises a bypass switch system adapted to selectively electrically connect and disconnect a primary alternating current supply to and from the load.

In a converter supply mode where the bypass switch system is controlled into a non-conducting state, and power is transferred to the load through the load supply converter system, a short circuit in the bypass switch system can cause exceeding of maximum allowed voltage in the load supply converter system due to an electric current flowing in the energy saving transfer route.

One of the problems associated with the above known power supply assembly is that detecting a short circuit in the bypass switch system is difficult during the converter supply mode.

SUMMARY

An object of the present invention is to provide a power supply assembly so as to solve the above problem. The objects of the invention are achieved by a power supply assembly which is characterized by what is stated in the independent claim. The preferred embodiments of the invention are disclosed in the dependent claims.

The invention is based on the idea of detecting a short circuit in the bypass switch system during the converter supply mode by generating a diagnostic voltage in a power connection of the load supply converter system connected to the load, wherein the diagnostic voltage is different from a voltage of the primary alternating current supply. Said difference between the diagnostic voltage and the voltage of the primary alternating current supply creates a short-circuit current flowing through the bypass switch system, and indicating presence of a short circuit in the bypass switch system.

An advantage of the power supply assembly of the invention is that a short circuit in the bypass switch system can be quickly detected in the converter supply mode. In an embodiment, the detection of the short circuit in the bypass switch system is realized with a hardware of a known power supply assembly, simply by reprogramming the control system of the power supply assembly.

BRIEF DESCRIPTION OF THE DRAWINGS

In the following, the invention will be described in greater detail by means of preferred embodiments with reference to the attached FIG. 1, which shows a simplified circuit diagram of a power supply assembly according to an embodiment of the invention.

DETAILED DESCRIPTION

FIG. 1 shows a simplified circuit diagram of a power supply assembly 101 comprising a source connection system 4, a load connection 71, a load supply converter system 8, an energy saving transfer route 457, a bypass switch system 5, a measurement system and a control system 909.

The source connection system 4 comprises two alternating current connections, and one direct current connection. One of the alternating current connections of the source connection system 4 is a primary source connection 41 adapted to be connected to a primary alternating current supply 301. The other of the alternating current connections of the source connection system 4 is a secondary source connection 42 adapted to be connected to a secondary alternating current supply 302. The direct current connection of the source connection system 4 is denoted with reference number 43, and is adapted to be connected to a direct current supply 461.

In an alternative embodiment, the source connection system comprises the primary source connection and at least one additional source connection.

The load connection 71 is adapted to be connected to a load 707. The load 707 is an alternating current load.

The load supply converter system 8 comprises a first converter 81, a DC link 2, a second converter 82, and a direct current converter 83. The DC link 2 comprises DC link capacitance. A first power connection 811 of the first converter 81 is a direct current connection connected electrically to the DC link 2. The second power connection 812 of the first converter 81 is an alternating current connection connected electrically to the load connection 71. A first power connection 821 of the second converter 82 is an alternating current connection connected electrically to the secondary source connection 42. The second power connection 822 of the second converter 82 is a direct current connection connected electrically to the DC link 2. A first power connection 831 of the direct current converter 83 is a direct current connection connected electrically to the direct current connection 43. A second power connection 832 of the direct current converter 83 is a direct current connection connected electrically to the DC link 2.

The first converter 81, second converter 82, and direct current converter 83 are bidirectional converters. The first converter 81 and the second converter 82 are functionally identical electric power converters.

Herein, two components are defined to be connected electrically to each other when there is a connection between the components enabling transfer of electric energy between the components.

In an alternative embodiment, the first power connection of the second converter is an alternating current connection connected electrically to the primary source connection.

The energy saving transfer route 457 connects the primary source connection 41 electrically to the load connection 71, and bypasses the load supply converter system 8. The bypass switch system 5 is provided in the energy saving transfer route 457, and adapted to disconnect the primary source connection 41 from the load connection 71. The bypass switch system 5 comprises a first bypass switch 51 and second bypass switch 52 connected in series. The first bypass switch 51 has a higher switching speed than the second bypass switch 52.

The first bypass switch 51 is a triac, and the second bypass switch 52 is a mechanical contactor. In an alternative embodiment, the first bypass switch is a bidirectional semiconductor switch of another type, and the second bypass switch is a mechanical switch of another type. In a further alternative embodiment, the first bypass switch is an ultrafast mechanical switch whose switching time from non-conducting state to conducting state is less than or equal to four milliseconds.

The measurement system is adapted for measuring an electric current flowing through the second power connection 812 of the first converter 81, a voltage present at the second power connection 812 of the first converter 81, an electric current flowing through the bypass switch system 5, a voltage present at the primary source connection 41, and an electric current flowing through the load connection 71. The measurement system comprises measurement sensors for measuring above listed electrical quantities. In alternative embodiments, the measurement system comprises measurement sensors and/or algorithms adapted to calculate electrical quantities based on information comprising control data of the first converter of the load supply converter system.

The control system 909 is adapted to control the load supply converter system 8 and the bypass switch system 5. The control system 909 is communicatively connected to the measurement system for receiving measurement information from the measurement system.

The control system 909 is adapted to provide a normal operation, and a system diagnostic operation for detecting a short circuit incident in which there is a short circuit in the bypass switch system 5, in the first bypass switch 51 to be precise. The system diagnostic operation is carried out in a converter supply mode of the power supply assembly. In the converter supply mode, the bypass switch system 5 is controlled into a non-conducting state, and power is transferred to the load connection 71 through the load supply converter system 8. In other words, the control system 909 configures the power supply assembly 101 for transferring power to the load connection 71 exclusively through the load supply converter system 8 while the energy saving transfer route 457 is currentless.

The system diagnostic operation comprises providing a diagnostic state for the bypass switch system 5, generating a diagnostic voltage in the second power connection 812 of the first converter 81, and detecting the short circuit incident if predetermined failure conditions are fulfilled. The control system 909 is adapted to provide the diagnostic state for the bypass switch system 5 by controlling the first bypass switch 51 into a non-conducting state, and controlling the second bypass switch 52 into a conducting state by sending control signals to the first bypass switch 51 and second bypass switch 52. The diagnostic voltage is generated in the second power connection 812 of the first converter 81 during the diagnostic state of the bypass switch system 5.

The diagnostic voltage is different from the voltage related to the primary source connection 41. Therefore, the diagnostic voltage is a voltage different from the voltage of the primary alternating current supply 301. In an embodiment, the diagnostic voltage has a different amplitude from the voltage related to the primary source connection. In another embodiment, the diagnostic voltage has a different frequency from the voltage related to the primary source connection. In yet another embodiment, the diagnostic voltage has a different phase from the voltage related to the primary source connection. In yet another embodiment, the diagnostic voltage has a different waveform from the voltage related to the primary source connection.

During the system diagnostic operation, the primary alternating current supply 301 is connected electrically to the primary source connection 41. Otherwise, a short circuit in the bypass switch system 5 could not create an electric current in the energy saving transfer route 457.

The control system 909 is adapted to carry out the system diagnostic operation in connection with starting up of the power supply assembly 101, subsequent to controlling the first bypass switch 51 into the non-conducting state, and periodically. In alternative embodiments, the control system is adapted to carry out the system diagnostic operation in at least one predetermined situation.

As a response to the detected short circuit incident, the control system 909 is adapted to provide response measures comprising informing a user of the power supply assembly 101 about the detected short circuit incident, and controlling the second bypass switch 52 into the non-conducting state. In alternative embodiments, the control system is adapted to provide at least one response measure as a response to the detected short circuit incident.

In an embodiment, the voltage related to the primary source connection is measured by a sensor located at the primary source connection. In another embodiment, the voltage related to the primary source connection is measured by a sensor located somewhere in the primary alternating current supply, and a physical distance between the primary source connection and the voltage sensor is long, up to several kilometres.

The predetermined failure conditions for the short circuit incident comprise the electric current related to the bypass switch system 5 exceeding a predetermined short circuit threshold value. The predetermined short circuit threshold value is 5% of the rated current of the load connection 71. In alternative embodiments, the predetermined short circuit threshold value is in a range of 1 to 8 percent of the rated current of the load connection. The predetermined short circuit threshold value is selected such that a probability of erroneous diagnosis is low.

The normal operation provided by the control system 909 comprises supplying energy to the load connection 71 through the load supply converter system 8 while the bypass switch system 5 is in a non-conducting state. During the normal operation, the first converter 81 generates to the second power connection 812 thereof a normal voltage that is similar to the voltage related to the primary source connection 41.

In addition to the converter supply mode, the control system 909 is adapted to provide a bypass mode. In the bypass mode, the bypass switch system 5 is controlled into a conducting state, and power is transferred to the load connection 71 exclusively through the energy saving transfer route 457.

It will be obvious to a person skilled in the art that the inventive concept can be implemented in various ways. The invention and its embodiments are not limited to the examples described above but may vary within the scope of the claims.

The invention claimed is:
1. A power supply assembly comprising:
a source connection system including at least one alternating current connection, the at least one alternating current connection including a primary source connection adapted to be connected to a primary alternating current supply;
a load connection adapted to be connected to a load;
a load supply converter system including a first converter including a first power connection and second power connection, wherein the second power connection is an alternating current connection connected electrically to the load connection;

an energy saving transfer route connecting the primary source connection electrically to the load connection, and bypassing the load supply converter system;

a bypass switch system provided in the energy saving transfer route, and adapted to disconnect the primary source connection from the load connection the bypass switch system including a first bypass switch and second bypass switch connected in series, wherein the first bypass switch has a higher switching speed than the second bypass switch;

a measurement system for measuring at least one electrical quantity related to the second power connection of the first converter, at least one electrical quantity related to the bypass switch system, and at least one electrical quantity related to the primary source connection; and a control system adapted to control the load supply converter system and the bypass switch system, the control system being communicatively connected to the measurement system, wherein the at least one electrical quantity related to the second power connection of the first converter includes electric current and voltage, the at least one electrical quantity related to the bypass switch system includes electric current, and the at least one electrical quantity related to the primary source connection includes voltage, and the control system is adapted to provide a system diagnostic operation comprising:

providing a diagnostic state for the bypass switch system by controlling the first bypass switch into a non-conducting state, and controlling the second bypass switch into a conducting state;

during the diagnostic state of the bypass switch system generating a diagnostic voltage in the second power connection of the first converter, wherein the diagnostic voltage is different from the voltage related to the primary source connection; and detecting a short circuit incident if predetermined failure conditions are fulfilled, the predetermined failure conditions include electric current related to the bypass switch system exceeding a predetermined short circuit threshold value.

2. The power supply assembly according to claim 1, wherein the first bypass switch is a semiconductor switch, and the second bypass switch is a mechanical switch.

3. The power supply assembly according to claim 2, wherein the first bypass switch is a bidirectional semiconductor switch.

4. The power supply assembly as claimed in claim 1 wherein the measurement system is adapted for measuring an electric current related to the load connection.

5. The power supply assembly as claimed in claim 1 wherein the control system is adapted to provide a normal operation including supplying energy to the load connection through the load supply converter system while the bypass switch system is in a non-conducting state, wherein during the normal operation the first converter generates to the second power connection thereof a normal voltage that is similar to the voltage related to the primary source connection.

6. The power supply assembly as claimed in claim 1 wherein the load supply converter system comprises a DC link including DC link capacitance, and the first power connection of the first converter is a direct current connection connected electrically to the DC link.

7. The power supply assembly as claimed in claim 6, wherein the load supply converter system comprises a second converter including a first power connection and second power connection, wherein the first power connection is an alternating current connection, and the second power connection is a direct current connection connected electrically to the DC link.

8. The power supply assembly as claimed in claim 7, wherein the least one alternating current connection of the source connection system includes a secondary source connection adapted to be connected to a secondary alternating current supply, and the first power connection of the second converter is connected electrically to the secondary source connection.

9. The power supply assembly as claimed in claim 6 wherein the source connection system comprises a direct current connection adapted to be connected to a direct current supply, and the load supply converter system includes a direct current converter including a first power connection connected electrically to the direct current connection, and a second power connection connected electrically to the DC link.

10. The power supply assembly as claimed in claim 1 wherein the control system is adapted to carry out the system diagnostic operation in connection with starting up of the power supply assembly, subsequent to controlling the first bypass switch into the non-conducting state, or periodically.

11. The power supply assembly as claimed in claim 1 wherein as a response to the detected short circuit incident, the control system is adapted to provide at least one response measure.

12. The power supply assembly according to claim 11, wherein the at least one response measure comprises informing a user of the power supply assembly about the detected short circuit incident, and/or controlling the second bypass switch into the non-conducting state.

13. The power supply assembly as claimed in claim 1 wherein the diagnostic voltage has at least one characteristic different from a corresponding characteristic of the voltage related to the primary source connection, the at least one characteristic including an amplitude, frequency, phase or waveform.

14. The power supply assembly as claimed in claim 1, the predetermined short circuit threshold value is in a range of 1-8% of the rated current of the load connection.

15. The power supply assembly as claimed in claim 7, wherein the source connection system includes a direct current connection adapted to be connected to a direct current supply, and the load supply converter system includes a direct current converter including a first power connection connected electrically to the direct current connection, and a second power connection connected electrically to the DC link.

16. The power supply assembly as claimed in claim 8, wherein the source connection system includes a direct current connection adapted to be connected to a direct current supply, and the load supply converter system includes a direct current converter including a first power connection connected electrically to the direct current connection, and a second power connection connected electrically to the DC link.

* * * * *